(12) United States Patent
Ishii et al.

(10) Patent No.: US 8,668,487 B2
(45) Date of Patent: Mar. 11, 2014

(54) MICRO-PATTERN TRANSFERRING STAMPER

(75) Inventors: Satoshi Ishii, Hitachi (JP); Masahiko Ogino, Hitachi (JP); Noritake Shizawa, Ninomiya (JP); Kyoichi Mori, Oiso (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/581,169

(22) PCT Filed: Feb. 16, 2011

(86) PCT No.: PCT/JP2011/053216
§ 371 (c)(1),
(2), (4) Date: Aug. 24, 2012

(87) PCT Pub. No.: WO2011/118289
PCT Pub. Date: Sep. 29, 2011

(65) Prior Publication Data
US 2012/0321738 A1    Dec. 20, 2012

(30) Foreign Application Priority Data
Mar. 25, 2010 (JP) ................................. 2010-069558

(51) Int. Cl.
*B29C 59/16* (2006.01)
(52) U.S. Cl.
USPC ........ 425/385; 425/174; 425/174.4; 264/446; 264/447; 264/494

(58) Field of Classification Search
USPC ........ 425/174, 174.4, 385; 264/446, 447, 494
See application file for complete search history.

(56) References Cited

U.S. PATENT DOCUMENTS

| | | | |
|---|---|---|---|
| 2009/0256287 A1* | 10/2009 | Fu et al. | 264/447 |
| 2010/0034911 A1 | 2/2010 | Mori et al. | |
| 2010/0155989 A1 | 6/2010 | Ishii et al. | |

FOREIGN PATENT DOCUMENTS

| | | | |
|---|---|---|---|
| JP | 2004-351693 A | 12/2004 | |
| JP | 2006-338844 A | 12/2006 | |
| JP | 2009-073078 A | 4/2009 | |
| JP | 2010-000419 A | 1/2010 | |
| JP | 2010-036514 A | 2/2010 | |
| JP | 2010-141064 A | 6/2010 | |

OTHER PUBLICATIONS http://www.toagosei.co.jp/english/business/advanced/index.html?main/english/business/advanced/products/aronox/index05.html (retrieved Jun. 10, 2013).*
H. Schmid and B. Michel; Siloxane Polymers for High-Resolution, High-Accuracy Soft Lithography; Macromolecules vol. 33, No. 8, 2000, pp. 3042-3049.

* cited by examiner

*Primary Examiner* — Timothy Kennedy
(74) *Attorney, Agent, or Firm* — Volpe and Koenig, P.C.

(57) ABSTRACT

A micro-pattern transferring stamper includes a supporting base material and a microstructure layer formed on the supporting base material, the microstructure layer is a polymer of a resin composition that mainly contains a silsesquioxane derivative containing a plurality of polymerizable functional groups, and one or plural kinds of monomer elements containing a plurality of polymerizable functional groups.

14 Claims, 5 Drawing Sheets

MICRO-PATTERN TRANSFERRING STAMPER

TECHNICAL FIELD

The present invention relates to a micro-pattern transferring stamper that is pushed against a transfer target to form a microstructure (a fine pattern) on a surface of the transfer target.

BACKGROUND ART

Conventionally, photolithography technologies are used as the technologies to form fine patterns that are required for a semiconductor device, etc. However, miniaturization of such patterns becomes advanced and when a required process dimension becomes small to the wavelength of light or so used for an exposure, it becomes difficult for the photolithography technologies to cope with such miniaturization. Hence, instead of the photolithography technologies, electron beam lithography devices that are a kind of charged particle beam devices become nowadays popular.

The pattern formation using such electron beams applies a technique of directly drawing a mask pattern unlike one-shot exposure techniques using light sources, such as i rays and excimer laser, to form a pattern. The larger then number of the patterns to be drawn is, the more the exposure (lithography) time increases, and thus it takes a time to complete the drawing of patterns. Accordingly, together with the advancement of the integration degree of semiconductor integrated circuits, necessary time to form the patterns increases, which may decrease the throughput.

Accordingly, in order to speed-up the electron beam lithography devices, cell projection methods which combine masks in various shapes and which collectively emit electron beams to form patterns in a complex shape have been developed. However, together with the advancement of the miniaturization of the patterns, electron beam lithography devices become larger and larger, and the mask position control becomes further precise, resulting in the increase of the device costs.

In contrast, nano-imprinting technologies are known which form highly precise patterns at low costs. An example nano-imprinting technology is to push a stamper formed with concavities and convexities (a surface profile) corresponding to the concavities and convexities of a pattern to be formed against a transfer target obtained by, for example, forming a resin layer on a predetermined substrate, thereby forming a micro-pattern in the resin layer of the transfer target. Various applications of such nano-imprinting technologies are examined, such as formation of recording bit patterns in a large-capacity recording medium, and formation of semiconductor-integrated-circuit patterns.

Conventional hard stampers like silica used for the nano-imprinting technologies cannot cope with the warpage of a transfer-target substrate or a minute protrusion thereof at the time of transfer, and transfer-failed regions are produced in a broad range. In order to suppress the transfer-failed regions, it is necessary to cope with both warpage of the substrate and protrusion thereof. Hence, soft resin stampers have been examined which can cope with both warpage of the substrate and protrusion thereof (see Non-patent Literature 1). Moreover, there is an example report for a multi-layer resin stamper that has a soft resin layer called as a buffer layer and provided between the base material and the microstructure layer. Furthermore, in the nano-imprinting technologies, the peeling of the transfer target and the microstructure layer largely affects the transfer precision, the demolding performance of both transfer target and microstructure layer is very important. The conventional stampers like silica used for the nano-imprinting technologies are given with the demolding performance by processing a surface of the stamper with a fluorine-based demolding agent (see Patent Literature 1). The same process is applied to the surface of the soft stamper, and such a stamper is used for pattern transfer.

PRIOR ART DOCUMENTS

Patent Literature

Patent Literature 1: JP 2004-351693 A

Non-Patent Literature

Non-patent Literature 1: B. Michel et al., Macromolecules, vol. 33, p. 3042 (2000)

DISCLOSURE OF INVENTION

Problem to be Solved by the Invention

According to the above-explained conventional stampers, however, the transfer precision of a pattern is likely to decrease due to the unevenness of the thickness of the applied demolding agent, and the demolding layer is deteriorated due to repetitive transfer, resulting in a transfer failure.

Hence, it is an object of the present invention to provide a micro-pattern transferring stamper that is a soft stamper having a microstructure layer which needs no demolding process and which does not decrease the transfer precision of a pattern by repetitive transfer. The term microstructure in the present invention means a structure in a nano-meter to micro-meter size.

Means for Solving the Problem

To achieve the above object, an aspect of the present invention provides a micro-pattern transferring stamper that includes a supporting base material and a microstructure layer formed on the supporting base material, in which the microstructure layer is a polymer of a resin composition mainly containing: a silsesquioxane derivative containing a plurality of polymerizable functional groups; and one or plural kinds of monomer elements containing a plurality of polymerizable functional groups.

Moreover, to achieve the above object, another aspect of the present invention provides a micro-pattern transferring stamper that includes a supporting base material and a microstructure layer formed on the supporting base material, in which the microstructure layer being a polymer of a resin composition mainly containing a silsesquioxane derivative contains a plurality of polymerizable functional groups, and an inorganic fraction of the resin composition is equal to or less than 31 mass %.

Furthermore, to achieve the above object, the other aspect of the present invention provides a micro-pattern transferring stamper that includes: a light transmissive hard substrate; a light transmissive elastic plate; a flexible hard supporting base material; and a microstructure layer in this order, in which the microstructure layer is a polymer of a resin composition obtained by adding a fluorine element to a silsesquioxane derivative.

Effect of the Invention

According to the present invention, it becomes possible to provide the micro-pattern transferring stamper that is a soft stamper having a microstructure layer which needs no demolding process and which does not decrease the transfer precision of a pattern by repetitive transfer.

BEST MODE FOR CARRYING OUT THE INVENTION

Next, an explanation will be given of a micro-structure transferring pattern according to embodiments of the present invention with reference to the accompanying drawings as needed.

<Micro-Pattern Transferring Stamper>

Figure 1:
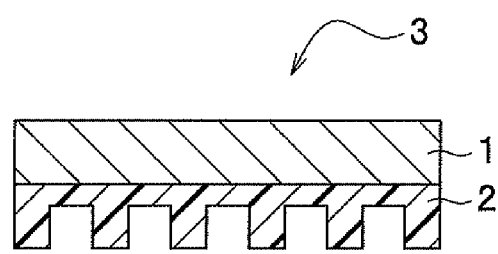
FIG. 1 is an exemplary diagram showing a micro-pattern transferring stamper according to an embodiment of the present invention.

FIG. 1 is an exemplary diagram showing a micro-pattern transferring stamper according to an embodiment of the present invention.

As shown in FIG. 1, a micro-pattern transferring stamper 3 of this embodiment includes a supporting base material 1 and a microstructure layer 2 on the supporting base material. The term microstructure indicates a structure formed in a nano-meter to micro-meter size.

With respect to the supporting base material 1, the shape, the material, the size, and the production scheme are not limited to any particular ones as long as the supporting base material can hold the microstructure layer 2.

Example shapes of the supporting base material 1 are a circular shape, a square shape, and a rectangular shape in a planar view, but the rectangular shape is especially preferable among those.

Example materials of the supporting base material 1 are a silicon wafer, various metal materials, glass, silica, and ceramic which have the strength and the workability. More specifically, exemplary materials are Si, SiC, SiN, polycrystal Si, Ni, Cr, Cu, and materials containing at least one of those. In particular, materials which allows light with a wavelength of at least 365 nm to pass therethrough are preferable, and silica and glass are preferable since those have a high transparency. When the supporting base material 1 is formed of such a material with a high transparency, as will be discussed later, if the microstructure layer 2 is formed of a photo-curable resin, light can be efficiently emitted to the photo-curable resin. Moreover, when the supporting base material 1 is formed of such a material with a high transparency, if a buffer layer (unillustrated) formed of a photo-curable resin is provided between the supporting base material 1 and the microstructure layer 2, light can be efficiently emitted to the photo-curable resin forming the buffer layer.

Moreover, a coupling treatment can be applied to a surface of the supporting base material 1 to enhance the bonding force between the microstructure layer 2 and the above-explained buffer layer (unillustrated).

The supporting base material 1 can be formed of equal to or greater than two kinds of layers having different elastic modulus. In the case of such a supporting base material 1, the laminating order of a layer with a high elastic modulus and a layer with a low elastic modulus, how to combine those layers, and the number of layers, etc., are not limited to any particular ones.

Examples of the supporting base material 1 having equal to or greater than two kinds of layers are ones formed by equal to or greater than two kinds of the above-explained materials selected, a combination of a layer formed of the above-explained material and a resin layer, and a combination of resin layers.

Specific example of the above-explained resin are phenolic resin (PF), urea resin (UF), melamine resin (MF), polyethylene-terephthalate (PET), unsaturated polyester (UP), alkyd resin, vinyl-ester resin, epoxy resin (EP), polyimide (PI), polyurethane (PUR), polycarbonate (PC), polystyrene (PS), acrylic resin (PMMA), polyamide (PA), ABS resin, AS resin, AAS resin, polyvinyl-alcohol, polyethylene (PE), polypropylene (PP), polytetrafluoroethylene (PTFE), polyarylate, cellulose acetate, polypropylene (PP), polyethylene-naphthalate (PEN), polybutylene-terephthalate (PBT), polyphenylene-sulfide (PPS), polyphenylene-oxide, cyclo-olefin polymer, polyactic acid, silicon resin, and diallyl phthalate resin. Any one of those can be used in solo or a plurality of different resins may be mixed and used. Moreover, such a resin may contain fillers, such as inorganic fillers or organic fillers.

The microstructure layer 2 is formed of the polymer of photo-curable resin composition, and has microstructures in a nano-meter to micro-meter size on a surface of such a microstructure layer.

<Resin Composition>

The resin composition forming the microstructure layer 2 mainly contains silsesquioxane derivative having a plurality of polymerizable functional groups, a monomer element having a plurality of polymerizable functional groups, and a photo-curable polymerization initiator.

<Silsesquioxane Derivative>

The silsesquioxane derivative is a generic term of network polysiloxane expressed by a composition formula of $RSiO_{1.5}$. It is known that the silsesquioxane derivative is techtonically ranked between inorganic silica (composition formula: $SiO_2$) and organic silicon (composition formula: $R_2SiO$), and has intermediate characteristics therebetween.

Specific examples of such a silsesquioxane derivative can be expressed by, for example, following formulae (1) to (5). The formula (1) indicates a silsesquioxane derivative with a ladder structure, the formula (2) indicates a silsesquioxane derivative with a random structure, the formula (3) indicates a silsesquioxane derivative with a T8 structure, the formula (4) indicates a silsesquioxane derivative with a T10 structure, and the formula (5) indicates a silsesquioxane derivative with a T12 structure.

[Chemical Formula 1]

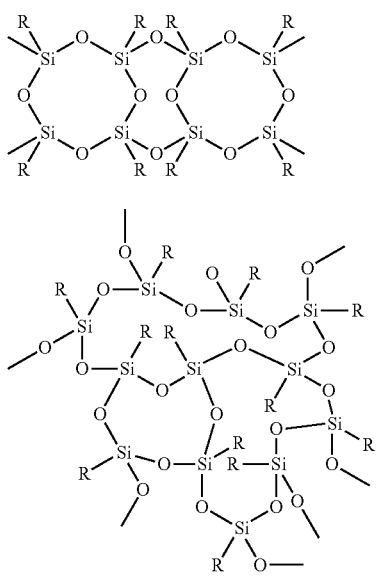

(1)

(2)

[Chemical Formula 2]

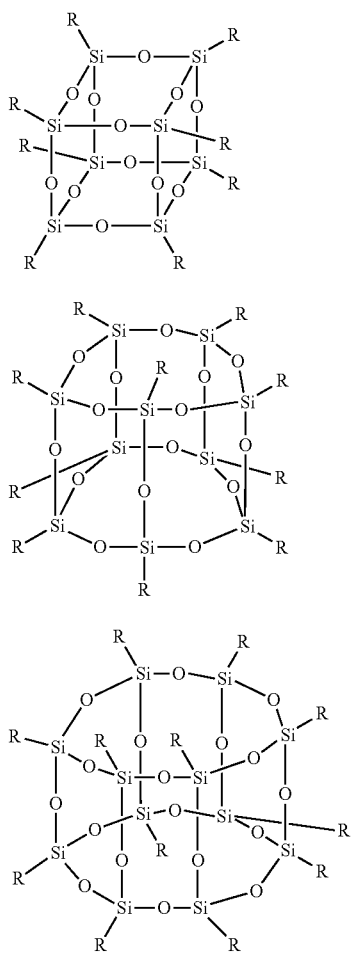

(3)

(4)

(5)

(where R in the formulae (1) to (5) can be same or different, R indicates hydrogen atom or organic group, and organic group indicates equal to or greater than two, preferably, equal to or greater than three polymerizable functional groups to be discussed later)

It is desirable that the polymerizable functional group should be a kind selected from one of the followings: vinyl group; epoxy group; oxetanyl group; vinyl-ether group; and (metha) acrylate group.

Regarding such a silsesquioxane derivative, it is desirable that a curing mechanism of a curable resin material (indicated by a reference numeral 6 in FIG. 3) selected in a transferring method to be discussed later and using the micro-pattern transferring stamper of the present invention and a curing mechanism of the silsesquioxane derivative should be different. More specifically, when the curable resin material for transferring is a radical polymerizable material, the photo-cationic polymerizable silsesquioxane derivative is desirable, and conversely, when the curable resin material for transferring is a photo-cationic polymerizable material, the photo-radial-polymerizable silsesquioxane derivative is desirable.

Commercially available silsesquioxane derivatives can be used.

It is desirable that the contained percentage of the silsesquioxane derivative in the resin composition should be equal to or greater than 50 mass %.

<Monomer Element>

An example monomer element is one containing equal to or greater than two polymerizable functional groups selected from the followings: vinyl group; (metha) acrylate group; epoxy group; oxetanyl group; and vinyl-ether group, and has no particular limitation in the skeleton, etc. However, a monomer element is desirable which cures through the same mechanism as that of the polymerizable functional group of the above-explained silsesquioxane derivative. Moreover, a monomer element having a perfluoro skeleton (fluorine-based composition) can be also used.

Example monomer elements having epoxy group are bisphenol A epoxy resin monomer, hydrogenated bisphenol A epoxy resin monomer, bisphenol F epoxy resin monomer, novolac-type epoxy resin monomer, aliphatic cyclic epoxy resin monomer, aliphatic linear epoxy resin monomer, naphthalene-type epoxy resin monomer, biphenyl-type epoxy resin monomer, and bifunctional-alcohol-ether-type epoxy resin monomer.

Example monomer elements having oxetanyl group are 3-ethyl-3-{[3-ethyl-oxetane-3-yl]methoxymethyl}oxetane, 3-ethyl-3-hydroxymethyloxetane, 1,4-bis[(3-ethyl-3-oxetanylmethoxy)methyl]benzene, 3-ethyl-3-(phenoxymethyl) oxetane, di[1-ethyl(3-oxetanyl)]methyl-ether, 3-ethyl-3-(2-ethyl-hexylo-xymethyl)oxetane, 3-ethyl-3-{[3-(triethoxysily)propoxy]methyl}oxetane, oxetanyl-silsesquioxane, and phenol-novolac-oxetane.

Example monomer elements having vinyl-ether group are ethylene-glycol-divinyl-ether, diethylene-glycol-divinyl-ether, triethylene-glycol-divinyl-ether, tetraethylene-glycol-divinyl-ether, butanediol-divinyl-ether, hexanediol-divinyl-ether, cyclohexane-dimethanol-divinyl-ether, isophthalate-di (4-vinyloxy)butyl, glutaric-di(4-vinyloxy)butyl, succinate-di (4-vinyloxy)butyl-trimethylol-propane-trivinyl-ether, 2-hydroxy-ethyl-vinyl-ether, hydroxy-butyl-vinyl-ether, and hydroxy-hexyl-vinyl-ether.

Example organic compositions having functional group of at least one of the followings: epoxy group; oxetanyl group; and vinyl-ether group are explained above, but the present invention is not limited to those organic compositions. Ones having polymerizable functional group, such as vinyl group, (metha) acrylate group, epoxy group, oxetanyl group, or vinyl-ether group, in a molecular chain can be basically used for the present invention. Moreover, it is presumed in this embodiment that the monomer element is a liquid in a normal temperature, but a solid monomer element can be also used.

The monomer element of a kind of a combination of equal to or greater than two kinds is used according to this embodiment.

<Photo-Curing Polymerization Initiator>

The photo-curing polymerization initiator is selected appropriately in accordance with the silsesquioxane derivative contained in the resin composition and the polymerizable functional group of the monomer element. In particular, a cationic polymerization initiator is desirable since it can suppress a curing failure originating from oxygen inhibition.

The cationic polymerization initiator is not limited to any particular one as long as it is an electrophilic agent, has a cation producing source, and can let the organic composition cured by light, and conventionally well-known cationic polymerization initiators can be used. In particular, a cationic polymerization catalyst that starts curing by ultraviolet is desirable since it enables a formation of a concavo-convex pattern at a room temperature, and also enables a formation of a further precise replica from a master mold.

Example cationic polymerization initiators are iron-allene complex compound, aromatic diazonium salt, aromatic iodonium salt, aromatic sulfonium salt, pyridinium salt, aluminum complex/silyl-ether, protonic acid, and Lewis acid.

Specific examples of the cationic polymerization initiator that starts curing by ultraviolet are IRGACURE261 (made by Ciba-Geigy Corporation), OPTOMER-SP-150 (made by ASAHI DENKA Corporation), OPTOMER-SP-151 (made by ASAHI DENKA Corporation), OPTOMER-SP-152 (made by ASAHI DENKA Corporation), OPTOMER-SP-170 (made by ASAHI DENKA Corporation), OPTOMER-SP-171 (made by ASAHI DENKA Corporation), OPTOMER-SP-172 (made by ASAHI DENKA Corporation), UVE-1014 (made by General Electronics Corporation), CD-1012 (made by Sartomer Corporation), San-Aid SI-60L (made by SANSHIN Chemical Industry Corporation), San-Aid SI-80L (made by SANSHIN Chemical Industry Corporation), San-Aid SI-100L (made by SANSHIN Chemical Industry Corporation), San-Aid SI-110 (made by SANSHIN Chemical Industry Corporation), San-Aid SI-180 (made by SANSHIN Chemical Industry Corporation), CI-2064 (made by NIPPON Soda Corporation), CI-2639 (made by NIPPON Soda Corporation), CI-2624 (made by NIPPON Soda Corporation), CI-2481 (made by NIPPON Soda Corporation), Uvacure 1590 (made by DAICEL-UCB Corporation), Uvacure 1591 (made by DAICEL-UCB Corporation), RHODORSIL Photo Initiator 2074 (made by Rhone-Poulenc Corporation), UVI-6990 (made by Union Carbide Corporation), BBI-103 (made by MIDORI KAGAKU Corporation), MPI-103 (made by MIDORI KAGAKU Corporation), TPS-103 (MIDORI KAGAKU Corporation), MDS-103 (MIDORI KAGAKU Corporation), DTS-103 (MIDORI KAGAKU Corporation), DTS-103 (MIDORI KAGAKU Corporation), NAT-103 (made by MIDORI KAGAKU Corporation), NDS-103 (made by MIDORI KAGAKU Corporation), and CYRAURE UVI6990 (made by Union Carbide Japan Corporation). Those polymerization initiators can be used in solo or can be used as a combination of equal to or greater than two kinds of those. Moreover, such polymerization initiators can be used in combination with conventionally well-known polymerization accelerator and sensitizer, etc.

It is desirable that such a resin composition should be a resin containing all elements other than the photo-curing polymerization initiator which have a polymerizable functional group.

However, even if the solvent element unintentionally mixed through a production process and having no reactive functional group is contained in the resin composition, it does not disturb the advantages of the present invention. Moreover, a surfactant agent may be contained in the resin composition in order to enhance the bonding strength between the supporting base material 1 and the resin composition within a range where accomplishment of the object of the present invention is not disturbed. Furthermore, additives like a polymerization inhibitor may be added as needed.

As explained above, it is desirable that the photo-curable resin composition should have the equivalent amount of the functional groups which is equal to or greater than 180 g/eq.

The functional group equivalent amount of the resin composition means the average value of the functional group equivalent amounts of respective elements forming the resin composition. The above-explained "functional group equivalent amount of element" can be expressed by a following formula (6).

$$\text{Functional Group Equivalent amount of Element} = (\text{Molecular Weight of Element})/(\text{Number of functional Groups per a Molecule of Element}) \quad \text{Formula (6)}$$

Moreover, it is desirable that the curing shrinkage percentage of the resin composition should be equal to or lower than 8.0%.

The curing shrinkage percentage can be expressed by a following formula (7).

$$\text{Curing Shrinkage Percentage} = 100 \times (\text{Specific Gravity of Polymer of Resin Composition} - \text{Specific Gravity of Resin Composition before Curing})/(\text{Specific Gravity of Resin Composition before Curing}) \quad \text{Formula (7)}$$

Furthermore, it is desirable that the inorganic fraction of the resin composition should be equal to or lower than 31 mass %.

The inorganic fraction means a ratio of silicic acid ($-SiO_{1.5}$) forming the silsesquioxane derivative ($RSiO_{1.5}$) in the resin composition, and can be expressed by a following formula (8).

$$\text{Inorganic Fraction} = 100 \times \text{Mass of Silicic Acid } (-SiO_{1.5}) \text{ in Resin Composition/Mass of Resin Composition} \quad \text{Formula (8)}$$

It is desirable that the elastic modulus of the resin composition after curing, i.e., the elastic modulus of the microstructure layer 2 should be equal to or greater than 1.0 GPa.

The elastic modulus in this embodiment is a physical value indicating the anti-deformation property, and means a proportional constant between stress and strain in elastic deformation. The elastic modulus depends on a temperature, and is not a unique value defined for the material composition, but in this embodiment, a value at a temperature of 30° C. that is a condition relating to a temperature in an optical nano-imprinting process is taken.

According to the above-explained micro-pattern transferring stamper 3, it is desirable that the supporting base material 1 and the microstructure layer 2 should be formed so as to have an optical transparency (optical transparency for wavelength of at least 365 nm). According to such a micro-pattern transferring stamper 3, a photo-curable resin can be used for a curable resin material 6 (see FIG. 3) to be discussed later of the transfer target. That is, the micro-pattern transferring stamper 3 can be used as a replica mold for optical nano-imprinting.

<Production Method of Micro-Pattern Transferring Stamper and Transferring Method>

Figure 2A:
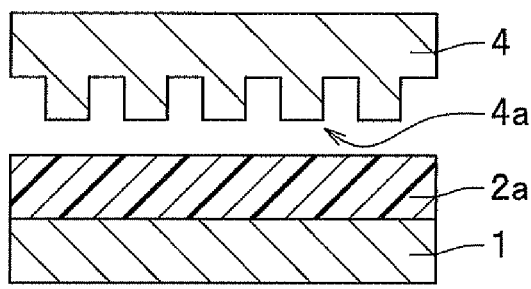
FIGS. 2A to 2C are process explanatory diagrams exemplarily showing a production method of the micro-pattern transferring stamper.
Figure 2A:
Figure 2B:
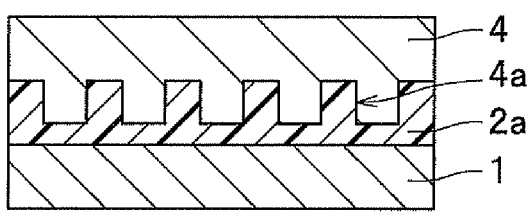
Figure 2B:
Figure 2C:
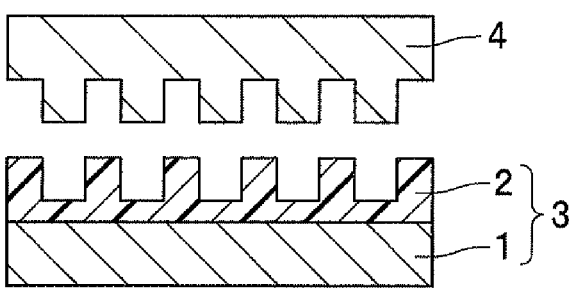

Next, an explanation will be given of a production method of the micro-pattern transferring stamper 3 according to this embodiment. FIGS. 2A to 2C to be referred below are process explanatory diagrams exemplarily showing a production method of the micro-pattern transferring stamper.

According to this production method, first, as shown in FIG. 2A, a master mold 4 formed with a micro-pattern 4a is prepared. Moreover, the resin composition 2a is applied on the supporting base material 1.

Next, as shown in FIG. 2B, the master mold 4 formed with the micro-pattern 4a is depressed against the resin composition 2a. Moreover, with the master mold 4 being depressed, the resin composition 2a is let cured to transfer the micro-pattern 4a of the master mold 4 to the resin composition 2a. The resin composition 2a is let cured by being irradiated with light.

Subsequently, as shown in FIG. 2C, the master mold 4 is peeled from the cured resin composition 2a (see FIG. 2B), and thus the micro-pattern transferring stamper 3 of this embodiment is obtained which has the microstructure layer 2 formed on the supporting base material 1. As will be discussed later in more detail, it is fine if the formed microstructure layer 2 is located in any locations on the supporting base material 1, and the shape of the region where the microstructure layer 2 is formed is not limited to any particular one and may be in a circular, square, or rectangular shape.

Figure 3:
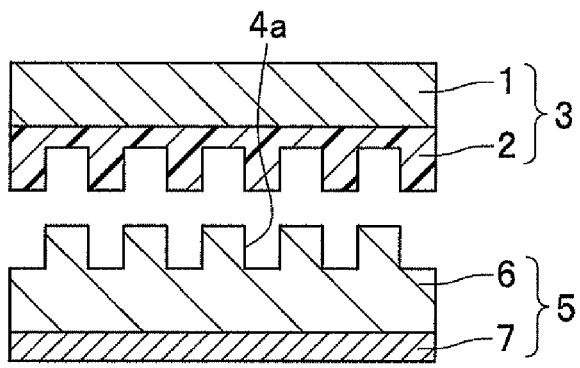
FIG. 3 is an exemplary diagram showing how the micro-pattern on the micro-pattern transferring stamper is transferred to a transfer target.

Next, an explanation will be given of a micro-pattern transferring method using the micro-pattern transferring stamper 3. FIG. 3 is an exemplary diagram showing how the micro-pattern of the micro-pattern transferring stamper is transferred to the transfer target.

According to this transferring method, as shown in FIG. 3, a transfer target 5 having the curable resin material 6 provided on a transfer target substrate 7 is used.

The transfer target substrate 7 is not limited to any particular one, and can be designed as needed depending on the application of the microstructure obtained by the transfer of the micro-pattern. Specific examples of such a substrate are a silicon wafer, various metal materials, glass, silica, ceramic, and resins.

Example curable resin materials 6 are a photo-curable resin, a thermosetting resin, and a thermoplastic resin. When at least one of the photo-curable resin and the thermosetting resin is used as the curable resin material 6, as explained above, a photo-curable resin and a thermosetting resin are desirable which have a different curing mechanism from the curing mechanism of the silsesquioxane derivative that is the main element of the resin composition.

According to this transferring method, the micro-pattern transferring stamper 3 is depressed against the curable resin material 6 of the transfer target 5, and thus the micro-pattern 4a is transferred to the curable resin material 6, thereby obtaining the microstructure. As explained above, when the supporting base material 1 of the micro-pattern transferring stamper 3 and the microstructure layer 2 thereof are formed so as to have an optical transparency for light with a wavelength of equal to or greater than 365 nm, the photo-curable resin can be used for the curable resin material 6.

According to the above-explained micro-pattern transferring stamper 3 of this embodiment, since the microstructure layer 2 formed of a polymer (a cured material) of the resin composition mainly containing the silsesquioxane derivative and the monomer element is formed on the supporting base material 1, a demolding process is unnecessary for the transfer target 5, and thus successive transfer is enabled highly precisely. At this time, since the microstructure layer 2 is formed of the silsesquioxane derivative having the different curing mechanism from the curing mechanism of the curable resin material 6 of the transfer target 5, the micro-pattern transferring stamper 3 has a further superior demolding performance.

The micro-pattern transferring stamper 3 which needs no demolding process and which can enhance the successive transfer performance can reduce the running costs in the production of the microstructures.

Although the explanation was given of the embodiment of the present invention, the present invention is not limited to the above-explained embodiment and can be changed and modified in various forms.

Figure 4:
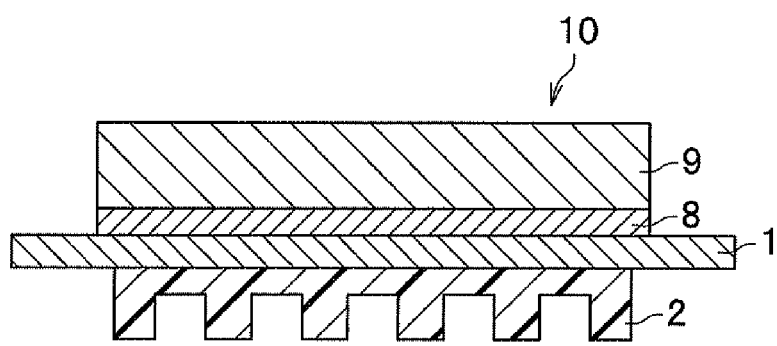
FIG. 4 is an exemplary diagram showing a micro-pattern transferring stamper according to another embodiment of the present invention.

According to the above-explained embodiment, the explanation was given of the micro-pattern transferring stamper 3 having the microstructure layer 2 on the supporting base material 1, but another substrate can be further disposed on the opposite surface of the supporting base material 1 to the microstructure layer 2. FIG. 4 which will be referred next is an exemplary diagram showing a micro-pattern transferring stamper according to another embodiment of the present invention.

As shown in FIG. 4, a micro-pattern transferring stamper 10 includes, on an opposite surface of the flexible supporting base material 1 to the microstructure layer 2, an elastic plate 8 and a light transmissive hard substrate 9 in this order. It is presumed that the micro-pattern transferring stamper 10 is appropriate for the transfer target 5 shown in FIG. 3 and using a photo-curable resin composition as the curable resin material 6, and the microstructure 2, the supporting base material 1, and the elastic plate 8 are light transmissive.

The elastic plate 8 is formed of a rubber member. A specific example of such a rubber member is synthetic rubber, such as urethane rubber, or silicon rubber. It is preferable that the elastic plate 8 should have a thickness within a range from 3 mm to 15 mm.

The light transmissive hard substrate 9 is, for example, a transparent glass plate, silica plate, or plastic plate. Example plastic plates are an acrylic resin plate, and hard vinyl chloride plate. It is preferable that the light transmissive hard substrate 9 should have a thickness within a range from 10 mm to 30 mm.

The supporting base material 1, the elastic plate 8, and the light transmissive hard substrate 9 can be joined with each other by an adhesive. An example adhesive is a light transmissive adhesive, such as an acrylic-rubber-based optical adhesive, or a UV-curable polyester resin.

Those elastic plate 8 and light transmissive hard substrate 9 can be mechanically joined with each other using a jig (a ring, etc.,) or a fastening tool (a bolt, etc.,) prepared additionally. Moreover, suction holes may be formed in the light transmissive hard substrate 9, and the elastic plate 8 may be bonded to such a substrate by suctioning of a suction pump through the suction holes. The suction bonding and the above-explained mechanical joining can be applied simultaneously.

According to the above-explained micro-pattern transferring stamper 10, when a micro-pattern is transferred to the transfer target 5 shown in FIG. 3 by pushing such a stamper against the transfer target, because of the elasticity of the elastic plate 8, the microstructure 2 depresses the curable resin material 6 shown in FIG. 3 with uniform pressure, and thus the micro-pattern can be highly precisely transferred to the curable resin material 6. Moreover, since the microstructure layer 2 depresses the curable resin material 6 shown in FIG. 3 with the uniform pressure, it becomes possible to further surely prevent air from being trapped between the microstructure layer 2 and the curable resin material 6.

As explained above, when the elastic plate 8 has a thickness of equal to or greater than 3 mm, it becomes possible to sufficiently deform the supporting base material 1 and the microstructure layer 2, and thus the transfer precision of the micro-pattern is further enhanced. Moreover, when the elastic plate 8 has a thickness of equal to or smaller than 15 mm, it becomes possible to prevent a deformation of the elastic plate in a planar direction at the time of the transfer using the micro-pattern transferring stamper 10, thereby further surely preventing the supporting base material 1 from being displaced in the horizontal direction. This further enhances the transfer precision of the micro-pattern.

According to the micro-pattern transferring stamper 10, because of the rigidity of the light transmissive hard substrate 9, the mechanical strength of the micro-pattern transferring stamper 10 can be further increased.

As explained above, when the light transmissive hard substrate 9 has a thickness of equal to or greater than 10 mm, the micro-pattern transferring stamper 10 can have a sufficient mechanical strength. Moreover, when the light transmissive hard substrate 9 has a thickness of equal to or smaller than 30 mm, the optical transparency of the light transmissive hard substrate 9 can be maintained well.

According to the micro-pattern transferring stamper of the present invention, the shape (a planar shape) of the region where the microstructure layer is formed on the supporting base material and the location where such a microstructure is formed can be designed as needed regardless of the planar shape of the supporting base material.

FIGS. 5A to 5D which will be referred next are exemplary diagrams showing how to form the microstructure layer with respect to the supporting base material in a planar view.

Figure 5A:
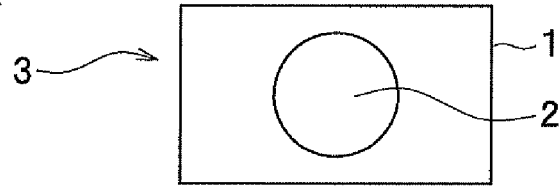
FIGS. 5A to 5D are exemplary diagrams illustrating how to form a microstructure layer on a supporting base material in a planar view.

As shown in FIG. 5A, according to the micro-pattern transferring stamper 3, the circular microstructure layer 2 in a planar view is formed at a substantial center of the supporting base material 1 in a rectangular shape in a planar view.

Figure 5B:
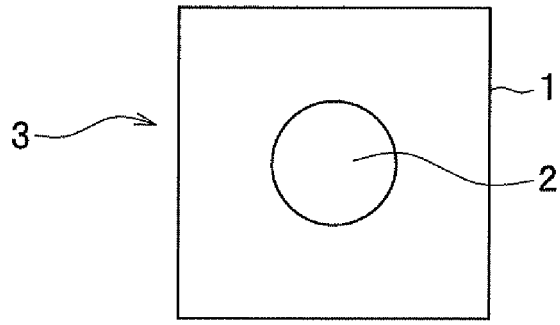
Figure 5C:
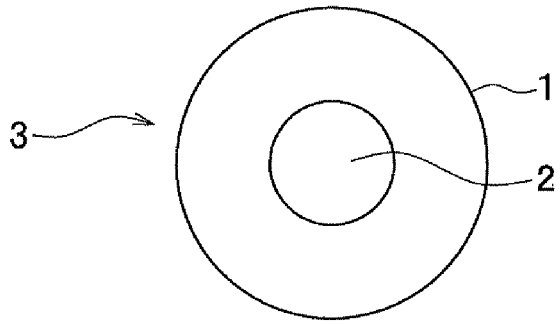

According to the micro-pattern transferring stamper 3 shown in FIG. 5B, the circular microstructure layer 2 in a planar view is formed at a substantial center of the supporting base material 1 in a square shape in a planar view. According to the micro-pattern transferring stamper 3 shown in FIG. 5C, the circular microstructure 2 in a planar view is formed in a substantial center of the supporting base material 1 in a circular shape in a planar view.

Figure 5D:
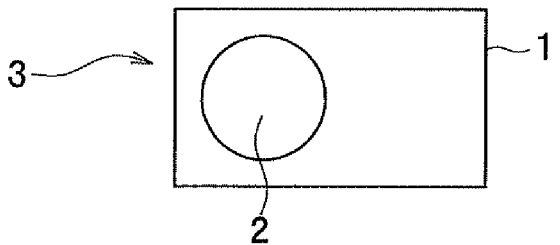

Moreover, according to the micro-pattern transferring stamper 3 shown in FIG. 5D, the circular microstructure layer 2 in a planar view is formed so as to be shifted outwardly from the center of the supporting base material 1 in the rectangular shape in a planar view.

Furthermore, the planar shape of the microstructure layer 2 is not limited to a circular shape, and can be in other shapes, such as an oval shape and a polygonal shape.

The location where the microstructure layer 2 is formed can be the center of the supporting base material 1 or shifted outwardly from such a center regardless of the planar shape of the supporting base material 1 and the planar shape of the microstructure layer 2.

EXAMPLES

Next, the present invention will be explained in more detail with reference to the examples. Terms "pts" and "%" used in the following explanation are all mass standards except that there is a special indication.

First Example

According to this example, the micro-pattern transferring stamper 3 was produced through the processes shown in FIGS. 2A to 2C.

<Preparation of Resin Composition 2a>

First of all, as shown in following table 1, 0.7 pts of silsesquioxane derivative OX-SQ SI-20 (made by TOA GOSEI Corporation, indicated as SQ(a) in table 1. The same is true of the following explanation) having a plurality of oxetanyl groups, 0.3 pts of 3-ethyl-3-{[3-ethyloxetane-3-yl] methoxymethyl}oxetane (made by TOA GOSEI Corporation, indicated as monomer element (a) in table 1. The same is true of the following explanation) that was bifunctional oxetane as the monomer element, and 0.06 pts of ADEKA OPTOMER-SP-172 (made by ASAHI DENKA Corporation, simply indicated as "polymerization initiator" in table 1. The same is true of the following explanation) as a cationic polymerization initiator were blended to prepare a photo-curable resin composition 2a for forming a microstructure layer 3.

The functional group equivalent amount [g/eq] of this resin composition 2a is shown in table 1.

TABLE 1

|  |  | First Example | Second Example | Third Example | Fourth Example | Fifth Example |
|---|---|---|---|---|---|---|
|  | pts by mass of SQ (a) | 0.7 | 0.9 | 0.7 | 0.7 | 0.9 |
|  | pts by mass of SQ (b) | — | — | — | — | — |
|  | pts by mass of monomer (a) | 0.3 | — | — | 0.2 | — |
|  | pts by mass of monomer (b) | — | 0.1 | 0.3 | 0.1 | — |
|  | pts by mass of monomer (c) | — | — | — | — | 0.1 |
|  | pts by mass of polymerization initiator | 0.06 | ← | ← | ← | ← |
|  | Stamper Structure | Double Layer | ← | ← | ← | ← |
| Microstructure Layer | Elastic Modulus [Pa] | 1.1 | 1.2 | 1.3 | 1.3 | 1.0 |
|  | Functional Group Equivalent Weight [g/eq] | 212 | 252 | 231 | 224 | 218 |
|  | Curing Shrinkage Percentage [%] | 4.7 | 4.9 | 5.0 | 4.7 | 4.8 |
|  | Inorganic Fraction [mass %] | 22 | 29 | 22 | 22 | 29 |
|  | Maximum Dimensional Error [%] | 22 | 17 | 22 | 22 | 27 |
|  | Durability | Good | Good | Good | Good | Good |

TABLE 1-continued

|  |  | Sixth Example | Seventh Example | Eighth Example | Ninth Example | Tenth Example |
|---|---|---|---|---|---|---|
|  | pts by mass of SQ (a) | 0.9 | 0.6 | 0.9 | 0.9 | 0.9 |
|  | pts by mass of SQ (b) | — | — | — | — | — |
|  | pts by mass of monomer (a) | 0.1 | 0.4 | — | — | — |
|  | pts by mass of monomer (b) | — | — | 0.1 | 0.1 | 0.1 |
|  | pts by mass of monomer (c) | — | — | — | — | — |
|  | pts by mass of polymerization initiator | ← | ← | ← | ← | ← |
|  | Stamper Structure | ← | ← | Triple Layer | Four-layered | Four-layered |
| Microstructure Layer | Elastic Modulus [Pa] | 1.0 | 1.1 | 1.2 | 1.2 | 1.2 |
|  | Functional Group Equivalent Weight [g/eq] | 243 | 196 | 252 | 252 | 252 |
|  | Curing Shrinkage Percentage [%] | 4.7 | 4.7 | 4.9 | 4.9 | 4.9 |
|  | Inorganic Fraction [mass %] | 29 | 19 | 29 | 29 | 29 |
|  | Maximum Dimensional Error [%] | 22 | 21 | 17 | 17 | 17 |
|  | Durability | Good | Good | Good | Good | Good |

<Production of Micro-Pattern Transferring Stamper 3>

Next, as the supporting base material 1, a glass plate of 20 mm by 20 mm having a thickness of 0.7 mm and having a surface subjected to a coupling treatment by KBM403 (made by SHIN-ETSU Chemical Corporation) was prepared. The resin composition 2a to be the microstructure layer 2 was applied on the surface of the supporting base material 1 having undergone the coupling treatment (see FIG. 2A). Next, a silicon (Si) made master mold 4 having a surface subjected to a demolding treatment by OPTOOL DSX (made by DAIKIN Industries Corporation) was prepared (see FIG. 2A). The micro-pattern formed in the master mold 4 was a line-and-space pattern (pitch: 90 nm, and height: 50 nm).

Subsequently, as shown in FIG. 2B, with the master mold 4 being depressed against the resin composition 2a, ultraviolet with a wavelength of 365 nm was emitted for 600 seconds to let the resin composition 2a to be cured. Next, as shown in FIG. 2C, the master mold 4 was peeled from the cured resin composition 2a (see FIG. 2B), and the microstructure layer 2 was formed on the supporting base material 1, thereby producing the micro-pattern transferring stamper 3 (a soft stamper) of the present invention. The micro-pattern transferring stamper 3 employed a double-layer structure (indicated as a stamper structure in table 1) of the supporting base material 1 and the microstructure layer 2.

Next, the elastic modulus [Pa], curing shrinkage percentage [%] of the microstructure layer 2 and the inorganic fraction [mass %] (the same is true of the following explanation for the inorganic fraction) of the resin composition 2a expressed by the formula (8) were obtained. Table 1 shows the results.

<Transfer of Micro-Pattern>

Next, successive transfer was performed using this micro-pattern transferring stamper 3. As the transfer target 5 shown in FIG. 3, one having a photo-radical polymerizable resin composition mainly containing acrylate-based monomer and applied as the curable resin material 6 on a glass substrate as the transfer target substrate 7 was used.

Subsequently, a maximum dimensional error [%] of the micro-pattern 4a when successive transfer was performed using the micro-pattern transferring stamper 3 was measured, and the durability of the microstructure layer 2 in the micro-pattern transferring stamper 3 was evaluated.

Regarding the maximum dimensional error [%], cured pattern shapes of the curable resin material 6 of the transfer target 5 at the first transfer and the 400th transfer were measured through an atomic force microscope (made by VEECO Corporation), and a maximum dimensional error of those results was calculated.

Figure 6:
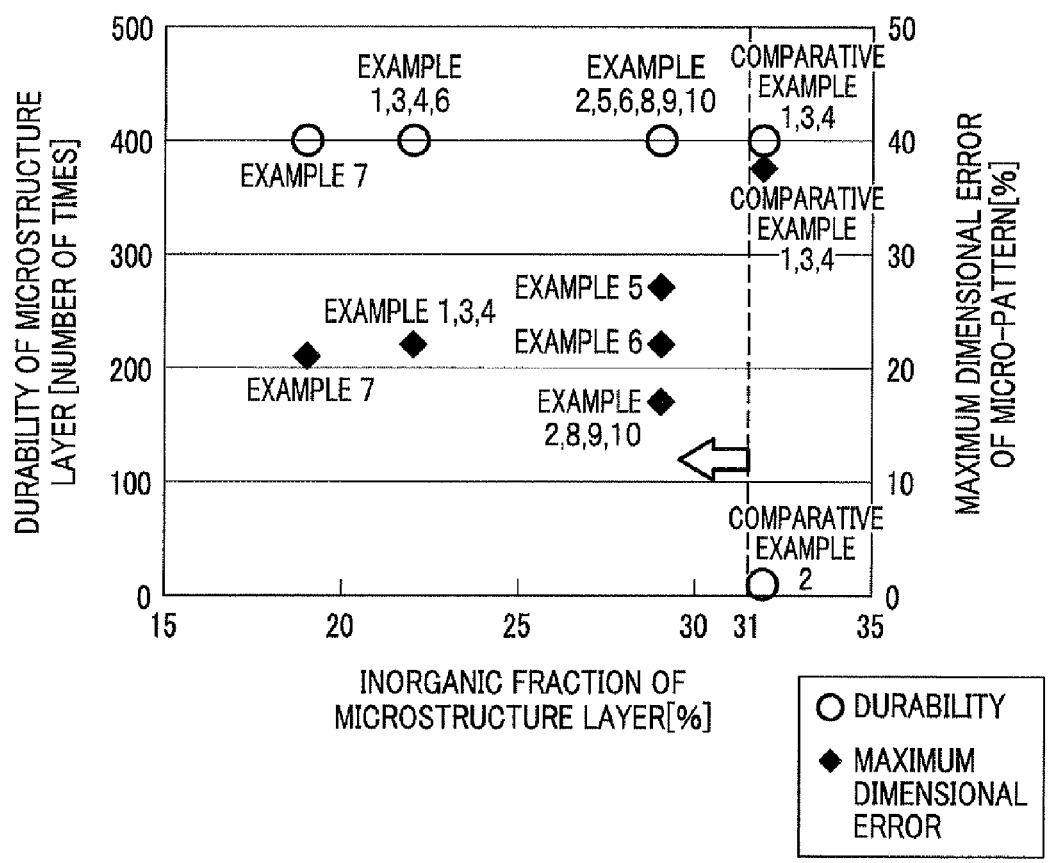
FIG. 6 is a graph showing a relationship among an inorganic fraction of the microstructure layer of the micro-pattern transferring stamper, a maximum dimensional error, and a durability, in which the horizontal axis indicates the inorganic fraction [%] of the microstructure layer, the right vertical axis indicates the maximum dimensional error [%] of a micro-pattern, and the left vertical axis indicates the durability [number of times] of the microstructure layer.

Regarding the durability, when the shape of microstructure layer 2 in the micro-pattern transferring stamper 3 was maintained well even the number of transferring exceeded 400 times, it was evaluated as good, and when the microstructure layer 2 broken down even the number of transferring did not reach 400 times, it was evaluated as poor. In table 1, a term "good" is indicated when the durability was maintained well and a term "poor" is indicated when the durability was poor. Moreover, an inorganic fraction [%], a maximum dimensional error [%], and a durability [number of times] are also shown in FIG. 6 together. FIG. 6 is a graph showing a relationship among an inorganic fraction of the microstructure layer of the micro-pattern transferring stamper, a maximum dimensional error and a durability. The horizontal axis indicates an inorganic fraction [%] of the microstructure layer, the right vertical axis indicates a maximum dimensional error [%] of the micro-pattern, and the left vertical axis indicates a durability [number of times] of the microstructure layer.

Second Example

In this example, the micro-pattern transferring stamper 3 having the microstructure layer 2 was produced through the same method as that of the first example. In this case, the resin composition 2a was prepared through the same way as that of the first example except that the silsesquioxane derivative OX-SQ SI-20 (made by TOA GOSEI Corporation) indicated as SQ (a) in table 1 was set to be 0.9 pts and instead of the monomer element (a) in table 1, 0.1 pts of 1,4-bis(2,3-epoxypropyl)perfluorobutane (made by DAIKIN Industries Corporation, indicated as monomer element (b) in table 1. The same is true of the following explanation) that was diepoxy having a perfluoro skeleton was used, and the micro-pattern transferring stamper 3 was produced using those materials. Table 1 shows a functional group equivalent amount [g/eq] of the resin composition 2a, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Third Example

In this example, the micro-pattern transferring stamper 3 having the microstructure layer 2 was produced through the same method as that of the first example. In this case, the resin composition 2*a* was prepared through the same way as that of the first example except that 0.3 pts of 1,4-bis(2,3-epoxypropyl)perfluorobutane (made by DAIKIN Industries Corporation) that was the monomer element (b) was used instead of the monomer element (a) in table 1, and the micro-pattern transferring stamper 3 was produced using such a material. Table 1 shows a functional group equivalent amount [g/eq] of the resin composition 2*a*, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Fourth Example

In this example, the micro-pattern transferring stamper 3 having the microstructure layer 2 was produced through the same method as that of the first example. In this case, the resin composition 2*a* was prepared through the same way as that of the first example except that 0.2 pts of 3-ethyl-3-{[3-ethyloxetane-3-yl]methoxymethyl}oxetane (made by TOA GOSEI Corporation) as the monomer element (a) in table 1 and 0.1 pts of 1,4-bis(2,3-epoxypropyl)perfluorobutane (made by DAIKIN Industries Corporation) as the monomer element (b) were used, and the micro-pattern transferring stamper 3 was produced using those materials. Table 1 shows a functional group equivalent amount [g/eq] of the resin composition 2*a*, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Fifth Example

In this example, the micro-pattern transferring stamper 3 having the microstructure layer 2 was produced through the same method as that of the first example. In this case, the resin composition 2*a* was prepared through the same way as that of the first example except that the silsesquioxane derivative OX-SQ SI-20 (made by TOA GOSEI Corporation) indicated as SQ (a) in table 1 was set to be 0.9 pts and instead of the monomer element (a) in table 1, 0.1 pts of 1,4-butanedioldivinylether (made by NIPPON Carbide Corporation, indicated as monomer element (c) in table 1. The same is true of the following explanation) was used, and the micro-pattern transferring stamper 3 was produced using those materials. Table 1 shows a functional group equivalent amount [g/eq] of the resin composition 2*a*, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Sixth Example

In this example, the micro-pattern transferring stamper 3 having the microstructure layer 2 was produced through the same method as that of the first example. In this case, the resin composition 2*a* was prepared through the same way as that of the first example except that the silsesquioxane derivative OX-SQ SI-20 (made by TOA GOSEI Corporation) indicated as SQ (a) in table 1 was set to be 0.9 pts and 0.1 pts of 3-ethyl-3-{[3-ethyloxetane-3-yl]methoxymethyl}oxetane (made by TOA GOSEI Corporation) as the monomer element (a) in table 1 was used, and the micro-pattern transferring stamper 3 was produced using those materials. Table 1 shows a functional group equivalent amount [g/eq] of the resin composition 2*a*, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Seventh Example

In this example, the micro-pattern transferring stamper 3 having the microstructure layer 2 was produced through the same method as that of the first example. In this case, the resin composition 2*a* was prepared through the same way as that of the first example except that the silsesquioxane derivative OX-SQ SI-20 (made by TOA GOSEI Corporation) indicated as SQ (a) in table 1 was set to be 0.6 pts and 0.4 pts of 3-ethyl-3-{[3-ethyloxetane-3-yl]methoxymethyl}oxetane (made by TOA GOSEI Corporation) as the monomer element (a) in table 1 was used, and the micro-pattern transferring stamper 3 was produced using those materials. Table 1 shows a functional group equivalent amount [g/eq] of the resin composition 2*a*, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 1 shows the results. Moreover, an inorganic fraction [%], a maximum dimensional error [%] and a durability [number of times] are also shown in FIG. 6 together.

Eighth Example

In this example, the same resin composition as that of the second example was prepared.

The micro-pattern transferring stamper 3 was produced through the following procedures (unillustrated).

First, the same master mold as that of the first example having undergone the demolding process by OPTOOL DSX (made by DAIKIN Industries Corporation) was prepared.

Next, the resin composition was applied to a surface of the master mold where the micro-pattern was formed by spin coating, and was irradiated with ultraviolet having a wavelength of 365 nm for 600 seconds to let the resin composition to be cured.

Next, a photo-curable epoxy-based resin was applied to the surface of the cured resin composition layer by spin coating, and the epoxy-based resin was let cured with a supporting base material having an optical transparency and a high elasticity being depressed against the epoxy-based resin. A surface of the supporting base material contacting the epoxy-based resin was subjected to a coupling treatment by KBM403 (made by SHIN-ETSU Chemical Corporation).

Subsequently, the master mold was peeled to produce the micro-pattern transferring stamper having a three-layer structure (indicated as a stamper structure in table 1) of the microstructure layer formed of the cured resin composition of the second example, the supporting base material formed of the cured epoxy-based resin, and the supporting base material (20 mm by 20 mm, thickness: 0.7 mm) with a high elasticity in this order.

The supporting layer in the micro-pattern transferring stamper had a lower elasticity than that of the microstructure layer. Moreover, the supporting base material was formed of glass which had a higher elasticity than those of the microstructure layer and the supporting layer. Table 1 shows a functional group equivalent amount [g/eq] of the resin composition, and an elastic modulus [Pa], a curing shrinkage percentage [%] and an inorganic fraction [mass %] of the microstructure layer.

Successive transfer was carried out using this micro-pattern transfer stamper like the first embodiment, and a maximum dimensional error [%] and a durability of the micro-pattern transferring stamper at this time were measured and evaluated. Table 1 shows the results. Moreover, an inorganic fraction [%], a maximum dimensional error [%] and a durability [number of times] are also shown in FIG. 6 together.

Ninth Example

In this example, the same resin composition as that of the second example was prepared.

The micro-pattern transferring stamper was produced through the following procedures (unillustrated).

First, the same master mold as that of the first example having undergone the demolding process by OPTOOL DSX (made by DAIKIN Industries Corporation) was prepared.

Next, the resin composition was applied to a surface of the master mold where the micro-pattern was formed by spin coating, and was irradiated with ultraviolet having a wavelength of 365 nm for 600 seconds to let the resin composition to be cured.

Next, photo-curable unsaturated polyester was applied on the surface of the cured resin composition layer by spin coating, and was irradiated with ultraviolet to let such unsaturated polyester to be cured, thereby forming a first supporting layer.

Next, a photo-curable epoxy-based resin was applied to the surface of the first supporting layer by spin coating, and the epoxy-based resin was let cured with a supporting base material having an optical transparency and a high elasticity being depressed against the epoxy-based resin to form a second supporting layer between the first supporting layer and the supporting base material. A surface of the supporting base material contacting the epoxy-based resin was subjected to a coupling treatment by KBM403 (made by SHIN-ETSU Chemical Corporation).

Subsequently, the master mold was peeled to produce the micro-pattern transferring stamper having a four-layered structure (indicated as a stamper structure in table 1) of the microstructure layer formed of the cured resin composition of the second example, the first supporting layer formed of the cured unsaturated polyester, the second supporting layer formed of the cured epoxy-based resin, and the supporting base material (20 mm by 20 mm, thickness: 0.7 mm) with a high elasticity in this order.

The first supporting layer in the micro-pattern transferring stamper had a lower elasticity than that of the microstructure layer. Moreover, the second supporting layer had a lower elasticity than that of the first supporting layer, and the supporting base material was formed of glass which had a higher elasticity than that of the second supporting layer.

Table 1 shows a functional group equivalent amount [g/eq] of the resin composition, and an elastic modulus [Pa], a curing shrinkage percentage [%] and an inorganic fraction [mass %] of the microstructure layer.

Successive transfer was carried out using this micro-pattern transfer stamper like the first embodiment, and a maximum dimensional error [%] and a durability of the micro-pattern transferring stamper at this time were measured and evaluated. Table 1 shows the results.

Tenth Example

In this example, the same resin composition as that of the second example was prepared.

The micro-pattern transferring stamper was produced through the following procedures (unillustrated).

First, the same master mold as that of the first example having undergone the demolding process by OPTOOL DSX (made by DAIKIN Industries Corporation) was prepared.

Next, the resin composition was applied to a surface of the master mold where the micro-pattern was formed by spin coating, and was irradiated with ultraviolet having a wavelength of 365 nm for 600 seconds to let the resin composition to be cured.

Table 1 shows a functional group equivalent amount [g/eq] of the resin composition, and an elastic modulus [Pa], a curing shrinkage percentage [%] and an inorganic fraction [mass %] of the microstructure layer.

Next, the cured resin composition layer was peeled from the mater mold. This resin composition layer was used as the microstructure layer 2 shown in FIG. 4, and the supporting base material 1, the elastic plate 8, and the light transmissive hard substrate 9 shown in FIG. 4 were prepared separately. Next, those were stacked together in the order shown in FIG. 4 by an adhesive to produce the micro-pattern transferring stamper 10.

A glass plate (20 mm by 20 mm, thickness 0.7 mm) was used as the supporting base material 1, a silicon rubber (made by DOW-CORNIG-TORAY Corporation, SYLGARD (registered trademark), thickness: 10 mm) was used as the elastic plate 8, and a silica substrate (thickness: 0.7 mm) was used as the light transmissive hard substrate 9.

Successive transfer was carried out using this micro-pattern transfer stamper 10 like the first embodiment, and a maximum dimensional error [%] and a durability of the micro-pattern transferring stamper at this time were measured and evaluated. Table 1 shows the results. Moreover, an inorganic fraction [%], a maximum dimensional error [%] and a durability [number of times] are also shown in FIG. 6 together.

First Comparative Example

In this comparative example, the micro-pattern transferring stamper 3 having the microstructure layer 2 was produced through the same method as that of the first example. In this case, the resin composition 2a was prepared through the same way as that of the first example except that the silsesquioxane derivative OX-SQ SI-20 (made by TOA GOSEI Corporation) indicated as SQ (a) in table 2 was set to be 1.0 pts and no monomer element in table 2 was used, and the micro-pattern transferring stamper 3 was produced using those materials. Table 2 shows a functional group equivalent amount [g/eq] of the resin composition 2a, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a maximum dimensional error [%] and a durability of the micro-pattern transferring stamper 3 at this time were measured and evaluated. Table 2 shows the results. Moreover, an inorganic fraction [%], a maximum dimensional error [%] and a durability [number of times] are also shown in FIG. 6 together.

TABLE 2

| | | First Comparative Example | Second Comparative Example | Third Comparative Example | Fourth Comparative Example |
|---|---|---|---|---|---|
| pts by mass of SQ (a) | | 1.0 | — | 1.0 | 1.0 |
| pts by mass of SQ (b) | | — | 1.0 | — | — |
| pts by mass of monomer (a) | | — | — | — | — |
| pts by mass of polymerization initiator | | 0.06 | 0.06 | 0.06 | 0.06 |
| Stamper Structure | | Double Layer | ← | Triple Layer | Four-layered |
| Microstructure Layer | Elastic Modulus [Pa] | 0.8 | 1.0 | 0.8 | 0.8 |
| | Functional Group Equivalent Weight [g/eq] | 262 | 165 | 262 | 262 |
| | Curing Shrinkage Percentage [%] | 5.0 | 8.9 | 5.0 | 5.0 |
| | Inorganic Fraction [mass %] | 32 | 32 | 32 | 32 |
| | Maximum Dimensional Error [%] | 37 | — | 37 | 37 |
| | Durability | Good | Poor (10 times) | Good | Good |

Second Comparative Example

In this comparative example, the micro-pattern transferring stamper 3 having the microstructure layer 2 was produced through the same method as that of the first example. In this case, the resin composition 2a was prepared through the same way as that of the first example except that instead of the silsesquioxane derivative OX-SQ SI-20 (made by TOA GOSEI Corporation) indicated as SQ (a) in table 2, 1.0 pts of silsesquioxane derivative AC-SQ (made by TOA GOSEI Corporation, indicated as SQ (b) in table 2) having a plurality of acrylic groups was used and no monomer element in table 2 was used, and the micro-pattern transferring stamper 3 was produced using those materials. Table 2 shows a functional group equivalent amount [g/eq] of the resin composition 2a, and an elastic modulus [Pa], a curing shrinkage percentage [%], and an inorganic fraction [mass %] of the microstructure layer 2.

Successive transfer was carried out using this micro-pattern transfer stamper 3 like the first embodiment, and a durability of the micro-pattern transferring stamper 3 at this time was evaluated. Table 2 shows the results.

In this comparative example, the microstructure layer 2 was damaged at the 10th transfer. Hence, no maximum dimensional error [%] was measured in this comparative example.

An inorganic fraction [%] and a durability [number of times] are also shown in table 6 together.

Third Comparative Example

In this comparative example, the same resin composition as that of the first comparative example was prepared. Next, using this resin composition, the micro-pattern transferring stamper was produced through the same way as that of the eighth example. Table 2 shows a functional group equivalent amount [g/eq] of the resin composition, and an elastic modulus [Pa], a curing shrinkage percentage [%], and an inorganic fraction [mass %] of the microstructure layer.

Successive transfer was carried out using this micro-pattern transfer stamper like the first embodiment, and a durability of the micro-pattern transferring stamper at this time was evaluated. Table 2 shows the results. Moreover, an inorganic fraction [%] and a durability [number of times] were also shown in table 6 together.

Fourth Comparative Example

In this comparative example, the same resin composition as that of the first comparative example was prepared. Next, using this resin composition, the micro-pattern transferring stamper was produced through the same way as that of the ninth example. Table 2 shows a functional group equivalent amount [g/eq] of the resin composition, and an elastic modulus [Pa], a curing shrinkage percentage [%], and an inorganic fraction [mass %] of the microstructure layer.

Successive transfer was carried out using this micro-pattern transfer stamper like the first embodiment, and a durability of the micro-pattern transferring stamper at this time was evaluated. Table 2 shows the results. Moreover, an inorganic fraction [%], a maximum dimensional error [%] and a durability [number of times] were also shown in table 6 together.

(Evaluation Result for Micro-Pattern Transferring Stamper in Examples and Comparative Examples)

As shown in table 1 and table 2, in the cases of the micro-pattern transferring stampers of the first example to the tenth example having the microstructure layer produced using a resin composition containing a silsesquioxane derivative, 3-ethyl-3-{[3-ethyloxetane-3-yl]methoxymethyl}oxetane as a monomer element, and 1,4-bis(2,3-epoxypropyl)perfluorobutane as diepoxy having a perfluoro skeleton, the maximum dimensional error after 400 successive transfer was relatively small, and had a good durability.

In contrast, in the cases of the micro-pattern transferring stamper of the first, fourth, and fifth comparative example having the microstructure layer produced using the resin composition containing the silsesquioxane derivative but no monomer element, it becomes clear that although the durability was obtained, the maximum dimensional error was large, and the transfer precision decreased as the number of transfer increased. Moreover, according to the micro-pattern transferring stamper of the second comparative example, the durability was insufficient.

Next, as shown in FIG. 6, it becomes clear that the micro-pattern transferring stamper having a small maximum dimensional error and a good durability includes the microstructure layer that has the inorganic fraction of equal to or smaller than 31%.

DESCRIPTION OF REFERENCE NUMERALS

1 Supporting base material
2 Microstructure layer
2a Resin composition
3 Micro-pattern transferring stamper
4 Master mold

The invention claimed is:

1. A micro-pattern transferring stamper comprising a supporting base material and a microstructure layer formed on the supporting base material,
the microstructure layer being a polymer of a resin composition containing:
equal to or greater than 50 mass % of, a silsesquioxane derivative containing a plurality of polymerizable functional groups; and
at least one kind of monomer element comprising 1,4-bis(2,3-epoxypropyl)perfluorobutane.

2. The micro-pattern transferring stamper according to claim 1, wherein the resin composition contains a photo-curable polymerization initiator.

3. The micro-pattern transferring stamper according to claim 2, wherein the photo-curable polymerization initiator is a cationic polymerizable catalyst that starts curing by ultraviolet.

4. The micro-pattern transferring stamper according to claim 1, wherein at least one kind of the monomer element is 3-ethyl-3-{[(3-ethyloxetane-3-yl)methoxy]methyl}oxetane.

5. The micro-pattern transferring stamper according to claim 1, wherein at least one kind of the monomer element is a monomer containing a perfluoro skeleton.

6. A micro-pattern transferring stamper comprising a supporting base material and a microstructure layer formed on the supporting base material,
the microstructure layer being a polymer of a resin composition containing equal to or greater than 50 mass % of a silsesquioxane derivative ($RSiO_{1.5}$) containing a plurality of polymerizable functional groups (—R),
at least one kind of monomer element comprising, 1,4-bis(2,3-epoxypropyl)perfluorobutane, and
an inorganic fraction of the resin composition expressed by the following formula being equal to or less than 31 mass %:

Inorganic fraction=100×mass of silicic acid (—$SiO_{1.5}$) in resin composition/mass of resin composition.

7. The micro-pattern transferring stamper according to claim 6, wherein the resin composition contains a photo-curable polymerization initiator.

8. The micro-pattern transferring stamper according to claim 7, wherein the photo-curable polymerization initiator is a cationic polymerizable catalyst that starts curing by ultraviolet.

9. The micro-pattern transferring stamper according to claim 6, wherein at least one kind of the monomer element is 3-ethyl-3-{[(3-ethyloxetane-3-yl)methoxy]methyl}oxetane.

10. The micro-pattern transferring stamper according to claim 6, wherein at least one kind of the monomer element is a monomer containing a perfluoro skeleton.

11. The micro-pattern transferring stamper according to claim 6, wherein an elastic modulus of the microstructure layer is equal to or greater than 1.0 GPa.

12. The micro-pattern transferring stamper according to claim 6, wherein a curing shrinkage percentage of the resin composition is equal to or lower than 8.0%.

13. The micro-pattern transferring stamper according to claim 6, wherein a functional group equivalent amount of the resin composition is equal to or greater than 180 g/eq.

14. A micro-pattern transferring stamper comprising a plurality of layers in the following order:
a light transmissive hard substrate, selected from the group of transparent glass plate, silica plate, or plastic plate;
a light transmissive elastic plate;
a flexible hard supporting base material, selected from the group of silicon wafer, various metal materials, glass, silica, or ceramic; and
a microstructure layer,
the microstructure layer being a polymer of a resin composition containing a silsesquioxane derivative and at least one kind of monomer element comprising 1,4-bis(2,3-epoxypropyl)perfluorobutane.

* * * * *